US005633781A

United States Patent [19]

Saenger et al.

[11] Patent Number: 5,633,781
[45] Date of Patent: May 27, 1997

[54] ISOLATED SIDEWALL CAPACITOR HAVING A COMPOUND PLATE ELECTRODE

[75] Inventors: Katherine L. Saenger, Ossining; David E. Kotecki, Hopewell Junction, both of N.Y.

[73] Assignee: International Business Machines Corporation, Armonk, N.Y.

[21] Appl. No.: 577,168

[22] Filed: Dec. 22, 1995

[51] Int. Cl.$^6$ .................................................. H01K 1/16
[52] U.S. Cl. .................. 361/321.4; 361/305; 361/321.5; 361/311; 257/296
[58] Field of Search .............................. 361/301.1, 301.4, 361/303–305, 306.1, 306.3, 311–313, 320–321.5; 365/145, 149; 257/295–296, 306–310; 29/25.41, 25.42; 437/47, 52, 60, 919

[56] References Cited

U.S. PATENT DOCUMENTS

| | | | |
|---|---|---|---|
| 4,591,738 | 5/1986 | Bialas, Jr. et al. | 307/296 R |
| 4,954,927 | 9/1990 | Park et al. | 361/328 |
| 5,081,559 | 1/1992 | Fazan et al. | 361/313 |
| 5,189,503 | 2/1993 | Suguro et al. | 257/310 |
| 5,192,704 | 3/1993 | McDavid et al. | 437/52 |
| 5,208,725 | 5/1993 | Akcasu | 361/313 |
| 5,313,089 | 5/1994 | Jones, Jr. | 257/295 |
| 5,335,138 | 8/1994 | Sandhu et al. | 361/303 |
| 5,365,096 | 11/1994 | Taniguchi | 257/296 |
| 5,366,920 | 11/1994 | Yamamichi et al. | 437/52 |
| 5,371,700 | 12/1994 | Hamada | 365/149 |
| 5,382,817 | 1/1995 | Kashihara et al. | 257/295 |
| 5,383,088 | 1/1995 | Chapple-Sokol et al. | 361/305 |
| 5,384,729 | 1/1995 | Sameshima | 365/145 |
| 5,392,189 | 2/1995 | Fazan et al. | 361/35 |
| 5,397,748 | 3/1995 | Watanabe et al. | 437/239 |
| 5,405,796 | 4/1995 | Jones, Jr. | 437/47 |
| 5,416,042 | 5/1995 | Beach et al. | 437/60 |
| 5,436,477 | 7/1995 | Hashizume et al. | 257/310 |
| 5,438,011 | 8/1995 | Blalock et al. | 437/52 |
| 5,438,012 | 8/1995 | Kamiyama | 437/60 |
| 5,442,213 | 8/1995 | Okudaira et al. | 257/310 |
| 5,498,889 | 3/1996 | Hayden | 257/301 |

FOREIGN PATENT DOCUMENTS

| | | | |
|---|---|---|---|
| 62-190869 | 8/1987 | Japan | H01L 27/10 |
| 03-011761 | 1/1991 | Japan | H01L 27/04 |
| 05-343615 | 12/1993 | Japan | H01L 27/04 |
| 70-94599 | 4/1995 | Japan | H01L 21/8242 |

OTHER PUBLICATIONS

D.E. Kotecki and K.L. Saenger, "Fabrication Process for Container and Crown Electrodes in Memory Devices", IBM Technical Disclosure Bulletin, vol. 38, No. 11, Nov. 1995, pp. 197–199.

P. Fazan et al., Patent Application filed Sep. 21, 1995 (Micron Semiconductor), Micron Docket No. 94–0355, "A Scalable Barrierless High Epsilon Capacitor Structure with Sub–Lithography Capacitor Spacing".

B. Gnade et al., Patent Application S/N 08/283,881 filed Aug. 1, 1994 (Texas Instruments & Advanced Technology Materials), "Improved MIM High Permittivity Capacitor Structure, and Process to Form Such a Structure".

*Primary Examiner*—Bot L. Ledynh
*Assistant Examiner*—Anthony Dinkins
*Attorney, Agent, or Firm*—Ira D. Blecker

[57] ABSTRACT

A capacitor structure is provided, with a first conductor on top of a substrate having at least one layer of dielectric material thereon; a first non-conductor on top of and substantially in register with the first conductor, the first conductor and first non-conductor having a first opening formed therein; a second conductor, in electrical contact with the first conductor, formed on the sidewalls of the first opening; a non-conductive sidewall spacer formed in the first opening and contacting the second conductor, the non-conductive sidewall spacer having a second opening formed therein; and a third conductor formed in the second opening.

49 Claims, 6 Drawing Sheets

ISOLATED SIDEWALL CAPACITOR HAVING A COMPOUND PLATE ELECTRODE

RELATED APPLICATIONS

This invention is related to the following copending U.S. patent applications:

1) Ser. No. 08/577,178, Attorney Docket YO9-95-108, entitled "Isolated Sidewall Capacitor";
2) Ser. No. 08/577,166, Attorney Docket FI9-95-150, entitled "Isolated Sidewall Capacitor with Dual Dielectric";
3) Ser. No. 08/577,165, Attorney Docket FI9-95-163, entitled "Sidewall Capacitor with L-Shaped Dielectric";

all filed even day herewith and all assigned to the present assigned. Each of the above are incorporated by reference herein in their entireties.

FIELD OF THE INVENTION

This invention is directed to capacitors and the manufacture of the same, and more particularly to a capacitor employing a structure which is suitable for use with high dielectric constant materials.

BACKGROUND OF THE INVENTION

In the manufacture of ultra large scale integration (ULSI) circuit devices, DRAM (dynamic random access memory) and FRAM (ferroelectric random access memory) chips have become increasingly dense. As density increases, feature size shrinks, and so too does memory cell size. The capacitors that are an integral part of memory cells must therefore take up a minimum of space (i.e. have a small "footprint") and still be capable of storing large amounts of electrical charge (i.e. a capacitance on the order of 30 femtofarads).

Capacitance is a function of dielectric area and the dielectric constant of the dielectric material, and is inversely proportional to the thickness of the dielectric. Thus one method of achieving increased capacitance in a smaller area is to use materials with higher dielectric constants as dielectrics. However, the use of high dielectric constant materials presents a problem when using traditional materials like silicon as an electrode. The silicon can react with the high dielectric constant material or oxidize during deposition of the high dielectric constant material and form an interface layer of silicon dioxide, which reduces the effective dielectric constant of the dielectric material.

Deposition temperature and leakage are other problems involved in high-dielectric constant materials. Because they must be deposited at relatively high temperatures, the first-deposited electrode is formed from a high melting point conductive material which does not oxidize or react with the dielectric. In addition, the electrode material should have a large work function to increase the Schottky barrier. Platinum (Pt) and other similar materials are suitable for use as electrodes in this situation. However, these electrode materials are typically difficult to pattern using conventional processes. For example, using reactive ion etching (RIE) to pattern Pt results in sloped sidewalls which, given a thick layer, can result in a significant reduction of available surface area on which to form the capacitor. Additionally, while high dielectric constant materials must be isolated from silicon, a good connection must be formed between one capacitor electrode and the semiconductor circuit elements in the substrate. Thus, there remains a need for a capacitor which can be produced using high dielectric constant materials yet avoids the problems associated with a reduction in the effectiveness of the finished structure.

SUMMARY OF THE INVENTION

It is therefore an object of the present invention to provide a capacitor which incorporates a high dielectric constant material which minimizes or avoids contact between silicon and the high dielectric constant material, especially during high dielectric constant material deposition.

It is a further object to provide such a capacitor whose method of fabrication minimizes patterning steps for the electrodes.

It is another object to provide a capacitor which incorporates a high dielectric constant material which allows a good connection between the capacitor and the semiconductor circuit elements in the substrate.

It is yet another object to provide such a capacitor which is suitable for large scale production.

The objects of the invention have been achieved by providing, according to a first aspect of the invention a capacitor structure, comprising:

a substrate having at least one layer of dielectric material thereon;

a first conductor on top of the substrate;

a first non-conductor on top of and substantially in register with the first conductor, the first conductor and first non-conductor having a first opening formed therein;

a second conductor, in electrical contact with the first conductor, formed on the sidewalls of the first opening;

a non-conductive sidewall spacer formed in the first opening and contacting the second conductor, the non-conductive sidewall spacer having a second opening formed therein; and a third conductor formed in the second opening.

According to a second aspect of the invention, there is provided a method for making a capacitor structure, comprising the steps of:

forming a first conductor on a substrate having at least one layer of dielectric material thereon;

forming a first non-conductor on top of and substantially in register with the first conductor, the first conductor and first non-conductor having a first opening formed therein;

forming a second conductor, in electrical contact with the first conductor, on the sidewalls of the first opening;

forming a non-conductive sidewall spacer in the first opening on the exposed sidewalls of the second conductor, the non-conductive sidewall spacer having a second opening formed therein; and forming a third conductor in the second opening.

BRIEF DESCRIPTION OF THE DRAWINGS

These and other features, aspects, and advantages will be more readily apparent and better understood from the following detailed description of the invention, in which.

DESCRIPTION OF THE PREFERRED EMBODIMENTS

Figure 1:
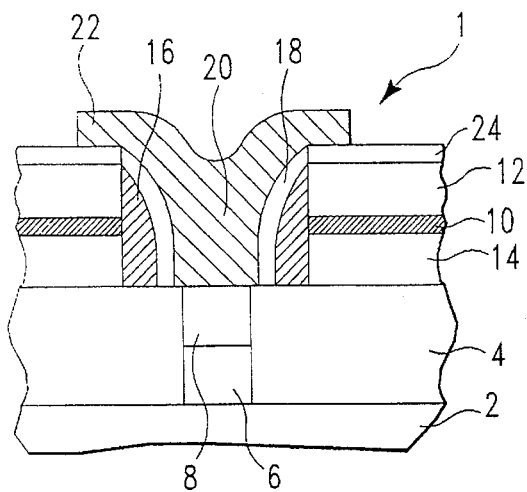
FIG. 1 shows an isolated sidewall capacitor.

Referring now to the drawings and more particularly to FIG. 1, one embodiment of the isolated sidewall capacitor with a compound plate electrode structure, generally indicated by 1, is shown. A substrate 2 has a dielectric (non-conductive) layer 4 formed thereon, and a conductive plug 6 embedded in dielectric layer 4. It should be understood that dielectric layer 4 may actually be comprised of sublayers of dielectric material. Plug 6 provides contact to the desired circuit elements (not shown) in substrate 2. An optional electrically conductive diffusion barrier 8 may be located on top of plug 6. A plate electrode forming an electrical connection between the capacitor dielectric and the common voltage or ground consists of a horizontal portion 10 formed from a first conductor, and a vertical portion 16 formed from a second conductor. Plate electrode horizontal portion 10 is formed on dielectric layer 4, followed by another dielectric layer 12. There may be another dielectric layer 14 between the horizontal portion 10 and dielectric layer 4, as shown in FIG. 1. Plate electrode vertical portion 16 is electrically connected to the plate electrode horizontal portion 10. The compound plate electrode structure allows the height of the capacitor to be much larger than the thickness of plate electrode material that must be etched through, an important advantage if a thick layer of electrode material would be hard to pattern.

A high dielectric constant sidewall spacer 18 is positioned as shown, and a third electrode 20 (conventionally referred to as a bottom electrode) is located within sidewall spacer 18, and may or may not have a top portion 22. If desired, the capacitor 1 may also include at least one additional dielectric layer 24. Note that the structure formed is a predominantly annular or oval capacitor when viewed from above (not shown).

Figures 2A, 2B, 2C:
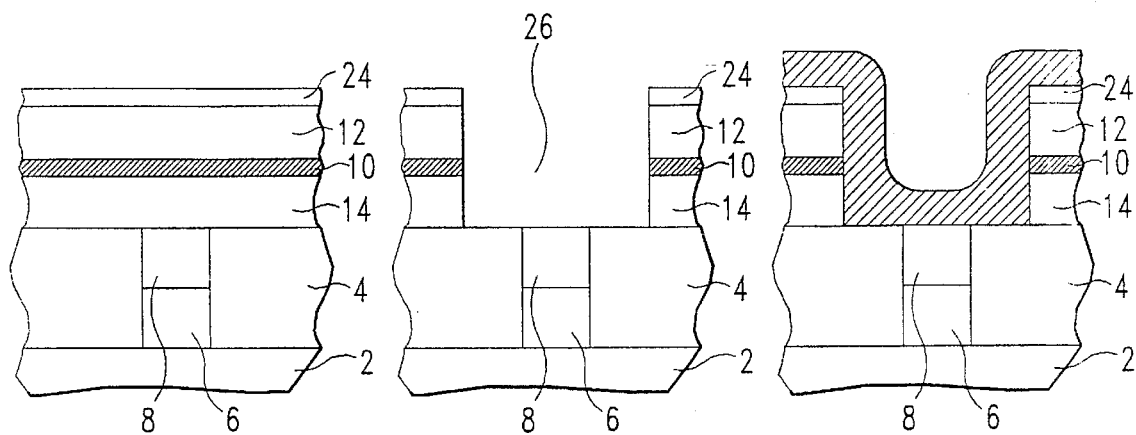
FIGS. 2(a) through 2(h) illustrate a set of steps that may be used to manufacture the capacitor of FIG. 1.

FIGS. 2(a) through 2(h) illustrate one set of steps that may be used to manufacture the capacitor 1 of FIG. 1. In FIG. 2(a), dielectric layer 4 has been formed on substrate 2, and patterned by conventional means, for example by reactive ion etching (RIE). Dielectric layer 4 is typically $SiO_2$, PSG (phosphosilicate glass), BPSG (borophosphosilicate glass), flowable oxide, spin-on-glass, or other conventional dielectric or a combination of any of these. Conductive plug 6 has been formed by a conventional process such as chemical vapor deposition (CVD) for example, and may be doped polysilicon, W, or any suitably conductive material followed by planarization by a process such as chemical mechanical polishing. Note that the diameter of plug 6 is not critical, and may be significantly narrower or wider than as shown. After an etch-back process to recess plug 6, electrically conductive diffusion barrier 8 was formed again by a conventional process such as sputtering, and may be $Ta_{1-x}Si_xN_y$, (with 0<<1 and y>0), TiN, or similar materials. The barrier layer was then conventionally planarized. If desired, there may be a metallic layer (not shown) between the plug 6 and diffusion barrier 8 to reduce the contact resistance.

Dielectric layer 14, conductor layer 10 and dielectric layers 12, 24 are then formed by conventional means, for example sputter deposition for layer 10 and low temperature CVD, plasma CVD, or sputter deposition for layers 12, 14 and 24. Diffusion barrier 8 can function as an etch stop during patterning of layers 10, 12, 14 and 24. Conductor layer 10 may be selected for example from the groups of materials known as noble metals (e.g. Au, Pt, Pd, Ir, Rh, etc.), alloys of noble metals with noble metals or non-noble metals, metals whose oxides are conducting (e.g. Ru, Mo, etc.), and electrically conducting oxides (e.g. $RuO_2$, $IrO_2$, $Re_2O_3$, etc.), nitrides such as TiN or WN, electrically conductive, oxidation-resistant nitrides (e.g., TaN, TaSiN) and silicides (e.g., $TaSi_2$) or similar materials, and may be approximately 200–1000 Å thick. The thin conducting layer reduces the amount of metal which needs to be etched by RIE which is a difficult process to do with Pt. Dielectric layers 12, 14 and 24 may be of $SiO_2$, $SiN_x$, $Al_2O_3$, $TiO_2$, BPSG, $HfO_2$ or similar materials, and may be approximately 1000–1500 Å thick. Dielectric layers 12 and 24 may also be made from high dielectric materials such as BST. Dielectric layer 14 should be an adhesion promoter for the horizontal portion 10.

In FIG. 2(b), conductive layer 10 and dielectric layers 12, 14 and 24 are patterned conventionally (by reactive ion etching, for example) to form an opening 26. Opening 26 may be approximately 0.2 to 0.6 microns in diameter and may be circular or oval in shape. Opening 26 is then cleaned using conventional means, for example RIE.

In FIG. 2 (c), the material for the vertical portion 16 of the plate electrode is conformally deposited and then anisotropically etched to form the conductive spacers 28 shown in FIG. 2 (d). The conductive spacers 28 are anisotropically overetched so that their height is less than that of the dielectric stack to result in vertical portion 16. As shown in FIG. 2 (e), the plate electrode vertical portion 16 is below the top of dielectric layer 24. Suitable materials for the vertical portion 16 include, for example, noble metals (e.g. Au, Pt, Pd, Ir, Rh, etc.), alloys of noble metals with noble metals or non-noble metals, metals whose oxides are conducting (e.g. Ru, Mo, etc.), and electrically conducting oxides (e.g. $RuO_2$, $IrO_2$, $Re_2O_3$, etc.). The lateral thickness of the vertical portion 16 should be about 500–1000 Angstroms but may be as low as 100 Angstroms.

Figure 3:
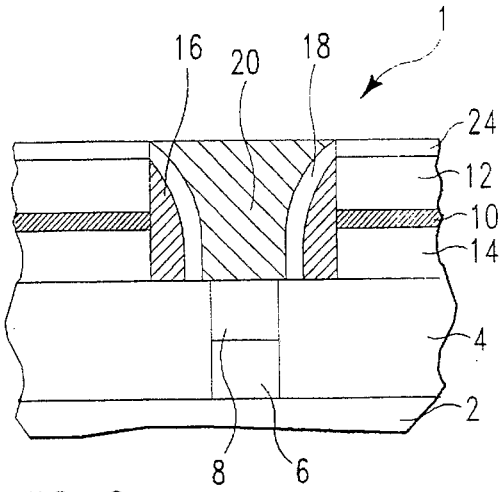
FIG. 3 shows the isolated sidewall capacitor of FIG. 1 but with its top surface planarized.
Figures 2D, 2E, 2F:
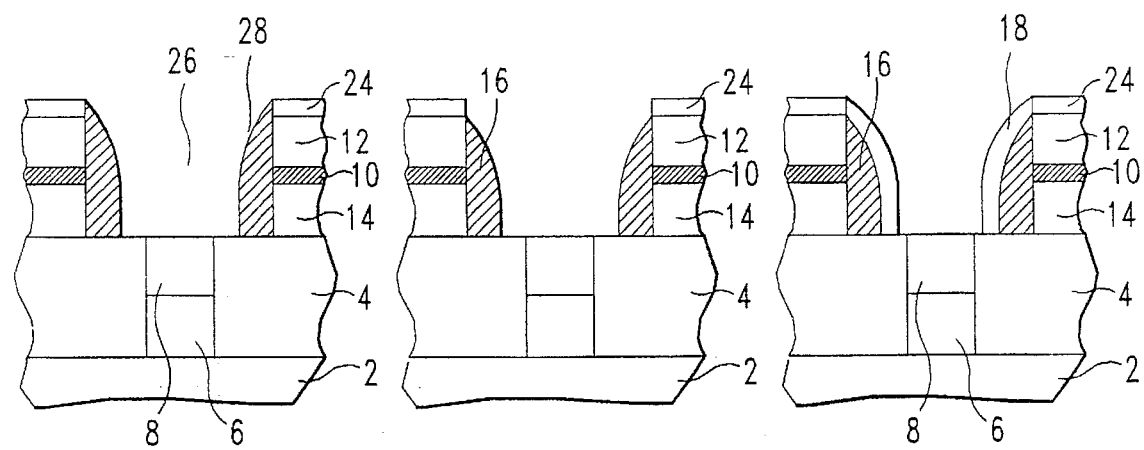
Figures 2G, 2H:
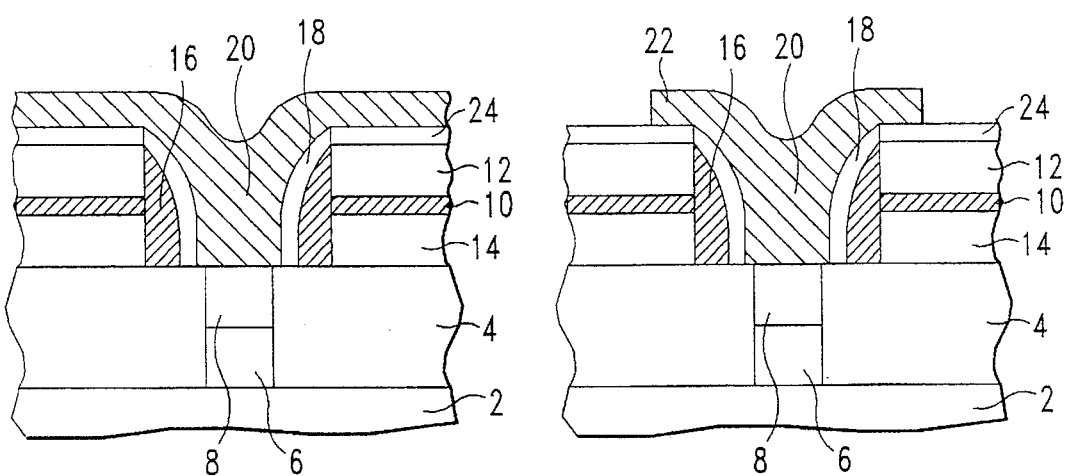

In FIG. 2(f), a conformal layer of high dielectric constant material is formed, for example by chemical vapor deposition (CVD) and is patterned to form sidewall spacer 18 by conventional means, for example by reactive ion etching (RIE). The sidewall spacer 18 covers or envelops the plate electrode vertical portion 16. The high dielectric constant material for the sidewall spacer 18 may be selected from the groups of materials known as ferroelectrics, paraelectrics, perovskites, pyrochlores, relaxors, layered perovskites or any material with a dielectric constant roughly greater than or equal to 20. Examples of such materials are $Ta_2O_5$, $(Ba,Sr)TiO_3$ (BST or BSTO), $BaTiO_3$, $SrTiO_3$, $PbZr_{1-x}Ti_xO_3$ (PZT), $PbZrO_3$, $Pb_{1-x}La_xTiO_3$ (PLT), $Pb_{1-x}La_x$ $(Zr_yTi_{1-y})_{1-x/4}O_3$ (PLZT), and $SrBiTaO_3$ (SBT). In FIG. 2(g), conductive material for the bottom electrode 20 is deposited, and in FIG. 2(h), patterned to form bottom electrode 20 by conventional means (by RIE or ion beam sputtering, for example). Note that bottom electrode 20 is isolated from the plate electrode vertical portion 16 and the plate electrode horizontal portion 10 by dielectrics 18 and 24. Note also that a self-aligned chemical mechanical polishing (CMP) process may be used if desired to pattern the bottom electrode 20 and eliminate top portion 22 at the same time to result in the structure shown in FIG. 3. Thus, the top surface of the bottom electrode 20 is flush with the top of the dielectric stack in FIG. 3. The conductive material for the bottom electrode 20 may be selected from the same group of materials as plate electrode horizontal portion 10, plus conductive materials whose oxides may be insulating (e.g. Ti, Al, TiN, W, etc.). In addition, the bottom electrode 20 may be a combination material such as a TiN liner with an overcoat of W or doped polysilicon.

After bottom electrode 20 is formed, the capacitor structure may be annealed. During annealing, diffusion barrier 8 acts either as a barrier to oxygen diffusion or a barrier to plug material diffusion or both.

Figures 7, 8, 9:
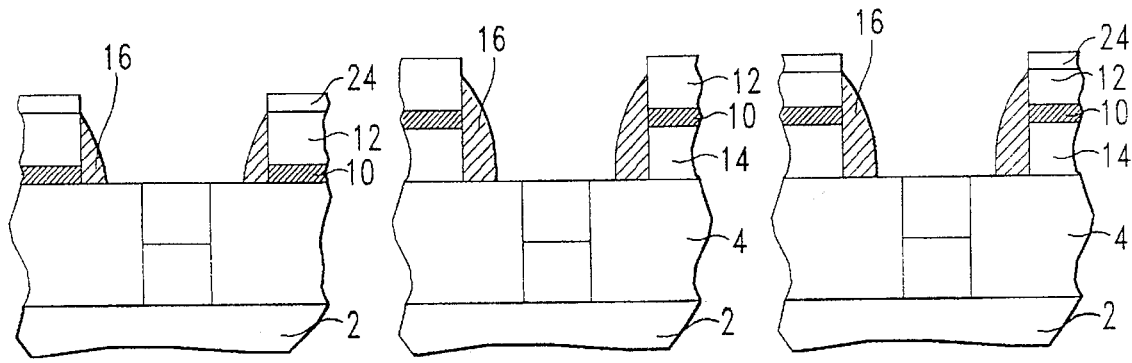
FIGS. 7 to 9 illustrate different arrangements of the compound plate electrode with respect to overlying and/or underlying layers of dielectric.

FIGS. 7 to 9 illustrate possible arrangements of the plate electrode horizontal portion 10 with overlying and/or underlying layers of dielectric. In FIG. 7, horizontal portion 10 is in direct contact with dielectric layer 4 of the substrate 2. Overlying horizontal portion 10 are at least two layers of dielectric 12, 24. FIG. 8 illustrates the situation where horizontal portion 10 has at least one underlying layer of dielectric 14 and at least one overlying layer of dielectric 12. Lastly, FIG. 9 shows at least one layer of dielectric 14 underneath horizontal portion 10 followed by at least two overlying layers of dielectric 12, 24, respectively. It should be understood that the high dielectric constant spacer 18 and bottom electrode 20 are removed from FIGS. 7 to 9 for clarity.

Figure 19A:
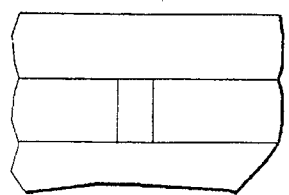
FIGS. 19(a) through 19(h) illustrate an alternate set of steps that may be used to manufacture the compound plate electrode of FIG. 7.
Figure 19B:
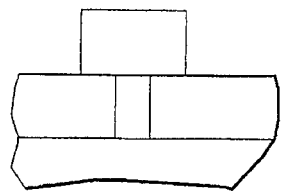
Figure 19C:
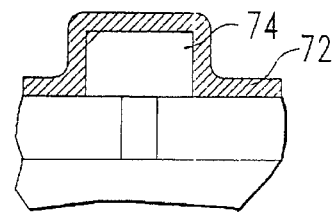
Figure 19D:
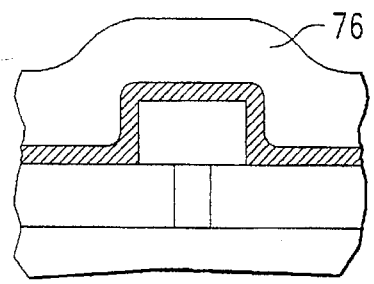
Figure 19E:
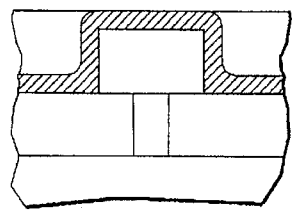
Figure 19F:
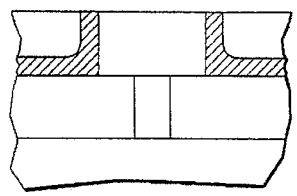
Figure 19G:
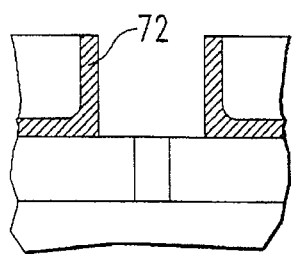
Figure 19H:
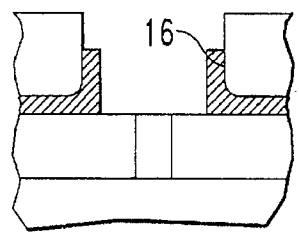

FIGS. 19(a) through 19(h) illustrate an alternative set of steps to form the L-shaped compound plate electrode of FIG. 7. In FIG. 19(a), disposable material such as $SiO_2$, diamond-like carbon or TiN is blanket deposited followed by patterning, by a process such as reactive ion etching (RIE), to form the disposable plug 74 shown in FIG. 19(b). Conductive electrode material 72 is then conformally deposited over disposable plug 74, as shown in FIG. 19(c), followed by the blanket deposition of a layer 76 of planarizable insulator material such as silicon oxide or silicon nitride (FIG. 19(d)), which is then followed by planarization (FIG. 19(e)) such as by chemical mechanical polishing. In the next step, as illustrated in FIG. 19(f), the top horizontal surface of electrode material 72 is removed, for example by a non-selective ion beam etch or RIE, to expose disposable plug 74. Disposable plug 74 is removed by, for example, $O_2$ ashing. The electrode material 72 is then anisotropically etched to reduce the height of electrode material 72 so as to result in vertical portion 16, as shown in FIG. 19(h). Due to the method by which the structure in FIG. 19(h) is formed, plate electrode horizontal and vertical portions 10 and 16, respectively, are formed simultaneously so that they are contiguous. The remaining part of the capacitor structure may be formed according to the steps of FIGS. 2(f)–2(h).

Figure 4:
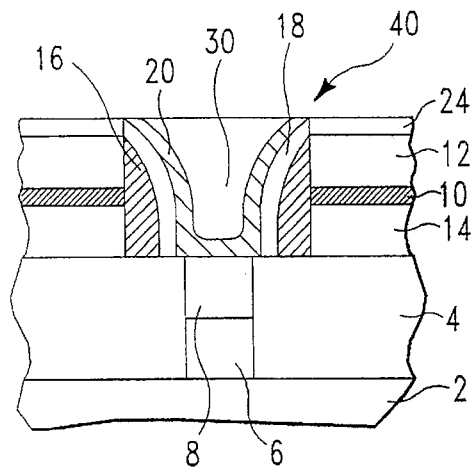
FIG. 4 shows an isolated sidewall capacitor with a filled bottom electrode.

FIG. 4 shows another embodiment of the isolated sidewall capacitor 40. FIG. 4 is similar to FIG. 1 except that bottom electrode 20 lacks a top portion (22 in FIG. 1) and also has a fill material 30 in its center.

Figures 5A, 5B, 5C:
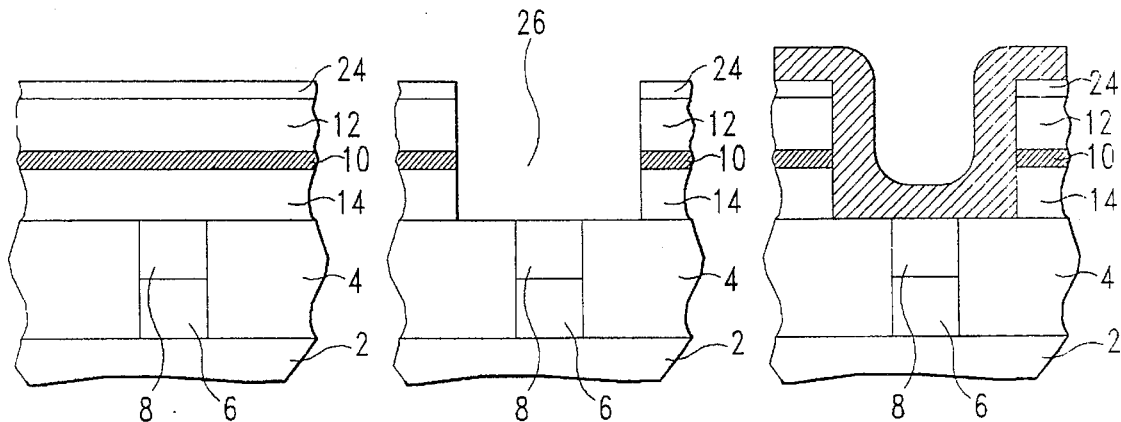
FIGS. 5(a) to 5(i) illustrate a set of steps that may be used to manufacture the capacitor of FIG. 4.
Figures 5D, 5E, 5F:
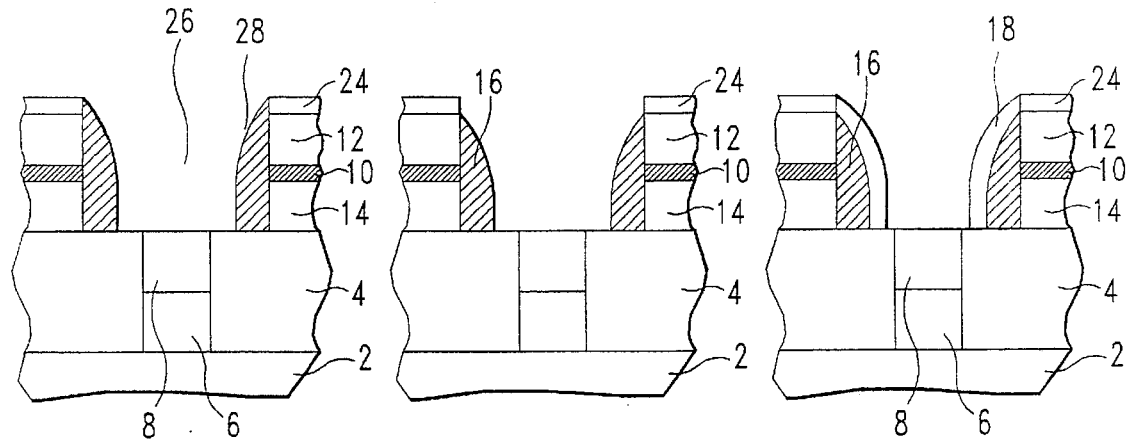
Figures 5G, 5H, 5I:
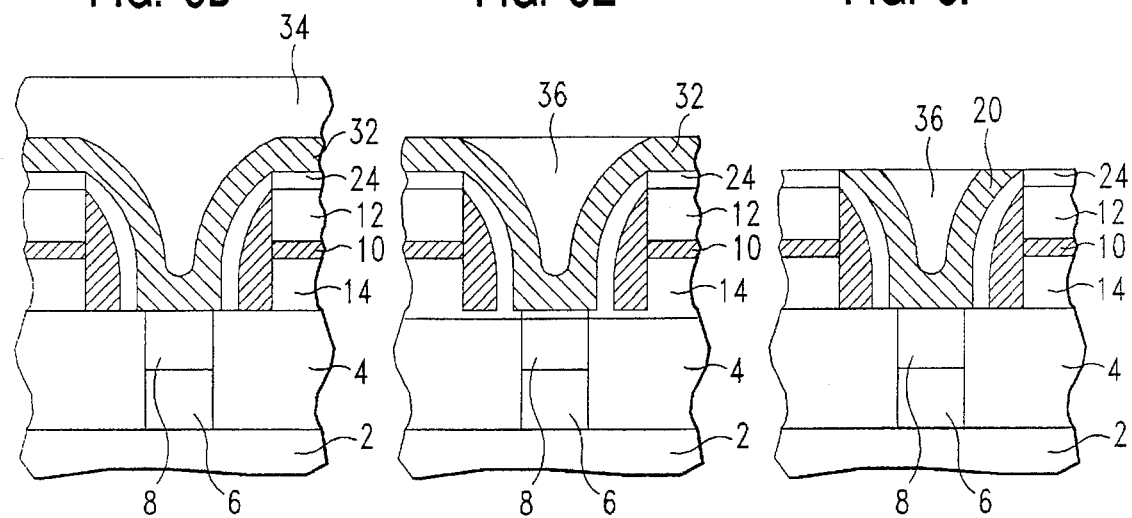

FIGS. 5(a) through 5(i) show the steps that may be used to manufacture the capacitor 40 of FIG. 4. FIGS. 5(a) to 5(f) are identical to FIGS. 2(a) to 2(f). In FIG. 5(g), a thin layer, preferably conformal, of conductive material 32 is formed, followed by a fill layer 34. Conductive layer 32 is selected from the same class of materials as bottom electrode 20, and fill layer 34 can be one or more layers, for example TaSiN, TiN, TiN plus dielectrics such as $SiO_2$, $Al_2O_3$, $SiN_x$, spin-on-glass, the same dielectrics without TiN, etc. In FIG. 5(h), fill layer 34 is reduced in thickness if necessary (by planarization, etchback, or other conventional means) to be approximately coplanar with conductive layer 32 and results in fill layer 36. In FIG. 5(i), conductive layer 32 is patterned conventionally (by blanket etch, for example) to form bottom electrode 20. The remaining fill layer 36 may be further etched back or removed altogether to result in the structure shown in FIG. 6. Note that, depending on the process chosen for planarization and optional removal, the fill material should be "planarizable", etch resistant while the bottom electrode is being etched, and selectively etchable with respect to the bottom electrode material if the fill material is to be removed from the final structure.

Figure 6:
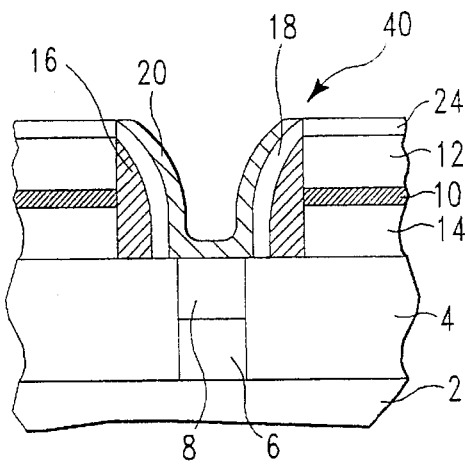
FIG. 6 shows the isolated sidewall capacitor of FIG. 4 with the filled area removed.

FIGS. 4 and 6 have an advantage over FIG. 1 in that bottom electrode 20 is defined by a self-aligned process, thus avoiding an additional lithographic alignment step. Also, the FIGS. 4 and 6 structures are more planar, making formation and processing of additional layers on top of the capacitor 40 easier.

Figure 10:
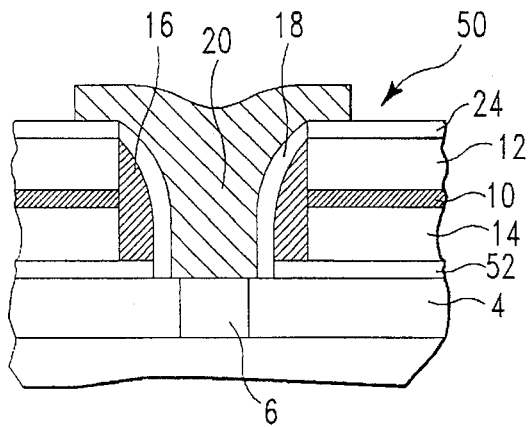
FIGS. 10 to 12 show the isolated sidewall capacitor with an additional non-conductive layer.

FIG. 10 shows another embodiment of the isolated sidewall capacitor 50. FIG. 10 is similar to FIG. 1, except that an additional dielectric layer 52 has been added between dielectric layers 4 and 14. Layer 52 functions as an etch stop or buffer layer when etching vertical portion 16. Layer 52 is etched to expose plug 6 prior to forming dielectric sidewall spacer 18.

Figure 11:
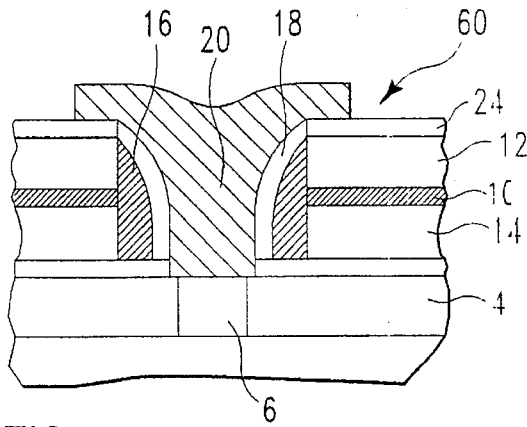
Figure 12:
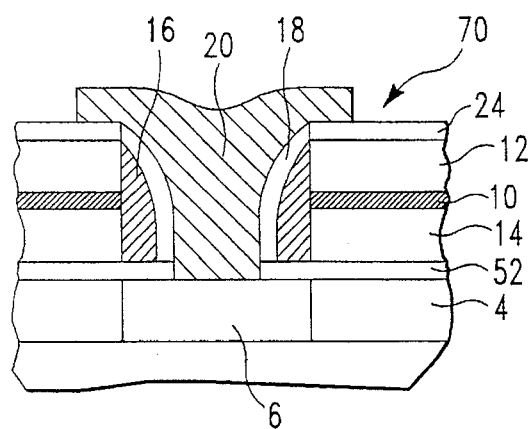

FIG. 11 shows a variation from the isolated sidewall capacitor 50 of FIG. 10. Dielectric layer 52 of isolated sidewall capacitor 60 is positioned between dielectric layers 4 and 14, but extends underneath dielectric sidewall spacer 18. Dielectric layer 52 in FIG. 11 functions as an etch stop when etching vertical portion 16, but also acts as a barrier layer to protect conductive plug 6 during formation of high dielectric constant sidewall spacer 18. After sidewall spacer 18 is formed, dielectric layer 52 is patterned to expose conductive plug 6, using sidewall spacer 18 as a mask. Isolated sidewall capacitor 70 of FIG. 12 is identical to capacitor 60 of FIG. 11 except that in FIG. 12, the diameter of plug 6 is larger than the diameter of bottom electrode 20. FIGS. 10 to 12 are inserted to illustrate the structure where the bottom electrode 20 is defined laterally by a non-self-aligned etching step.

Figure 13:
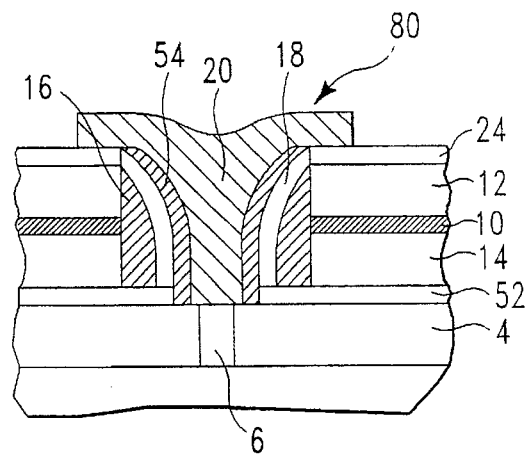
FIGS. 13 to 17 show embodiments of the isolated sidewall capacitor with a compound bottom electrode.
Figure 14:
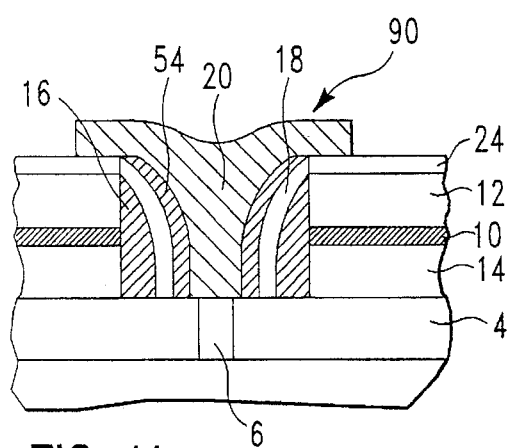
Figure 15:
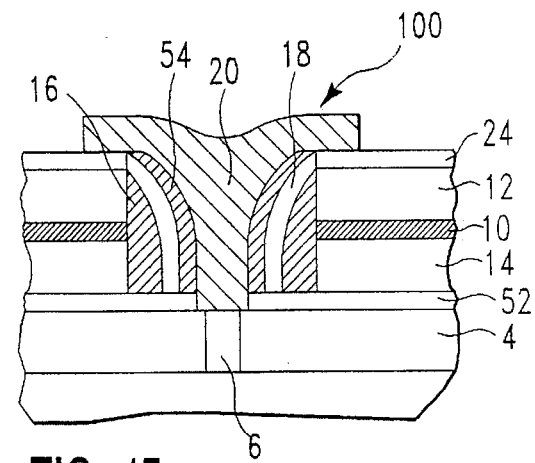

FIGS. 13 to 15 show an isolated sidewall capacitor with a compound bottom electrode. The capacitor 80 of FIG. 13 is similar to FIG. 11, with the addition of a conductive sidewall spacer 54 which extends from the top of dielectric layer 24 to the bottom of dielectric layer 52. Conductive sidewall spacer 54 is electrically connected to plug 6 via the conductive material in bottom electrode 20. Together, conductive sidewall spacer 54 and bottom electrode 20 form a compound bottom electrode.

One advantage of using a compound bottom electrode is that the portion of bottom electrode 20 in contact with plug 6 may be formed after an annealing of the critical interface between dielectric sidewall spacer 18 and conductive sidewall spacer 54. This eliminates the possibility of bottom electrode/plug reactions during annealing, and thus allows the use of a wider variety of materials for the portion of bottom electrode 20 contacting conductive sidewall spacer 54 to plug 6. For example, Pt could be used for the conductive sidewall spacer, allowing an oxygen anneal, and TiN/polysilicon might be used for the remainder of bottom electrode 20.

The capacitor 90 of FIG. 14 is similar to capacitor 80 of FIG. 13 except for the omission of dielectric layer 52 from FIG. 14.

The FIG. 15 capacitor 100 shows a modification from FIG. 13 in that the plate electrode vertical portion 16, dielectric sidewall spacer 18 and conductive sidewall spacer 54 extend only to the top of dielectric layer 52, and thus dielectric layer 52 is formed using conductive sidewall spacer 54 as a mask.

Figure 16:
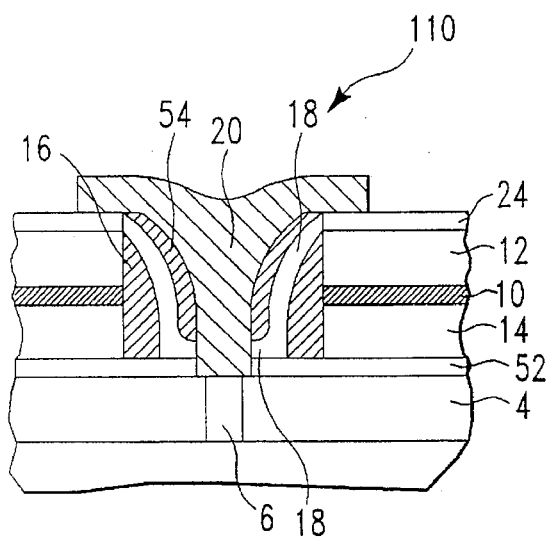
Figure 17:
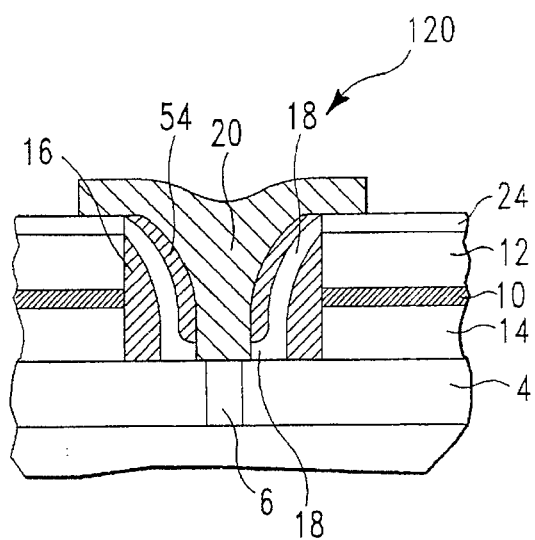

The FIGS. 16 and 17 capacitor embodiments 110 and 120, respectively, also have the common feature of a compound bottom electrode consisting of a bottom electrode 20, conductive sidewall spacer 54 and dielectric sidewall spacer 18. They additionally share the process sequence in which the conductive sidewall spacer 54 is formed by, for example, deposition followed by etching, prior to the delineation of the dielectric sidewall spacer 18 from the previously deposited conformal layer of high dielectric constant material. In FIG. 16 the capacitor contains the dielectric layer 52 which is etched, along with the high dielectric constant material to expose the plug 6, using the conductive sidewall spacer 54 as a mask. The embodiment of FIG. 17 is similar to that of FIG. 16 except that dielectric layer 52 has been omitted.

Figure 18:
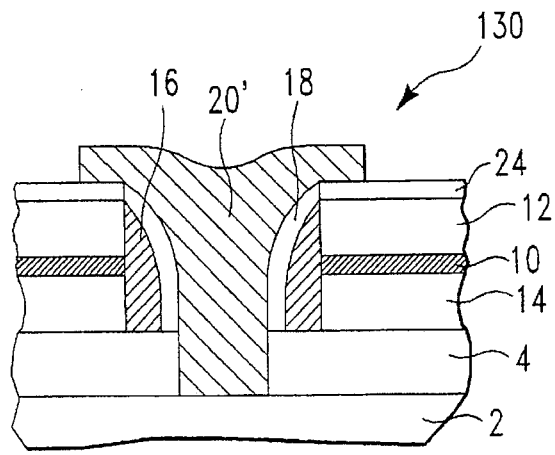
FIG. 18 shows an isolated sidewall capacitor with the bottom electrode also providing contact to other circuit elements in the substrate, all in accordance with the present invention.

FIG. 18 shows an isolated sidewall capacitor 130 with a bottom electrode 20' providing contact to other circuit elements in the substrate 2. FIG. 18 is similar to FIG. 1, except that isolated sidewall capacitor 130 in FIG. 18 has a bottom electrode 20' extended down to fill the space previously occupied by conductive plug 6. Processing is similar to that used to produce the structure of FIG. 1, except that the opening in layer 4 is etched after the rest of the capacitor is formed, using high dielectric constant sidewall spacer 18 as a mask. Thus a lithographic alignment step (typically used to initially form the opening in layer 4 for plug 6) is avoided. In addition, because a "plug" is formed after high dielectric constant material is deposited and patterned into sidewall spacer 18, there is no risk of a preexisting plug being destroyed during the deposition step. Note that the capacitor 130 of FIG. 18 can be modified to have an additional dielectric layer as shown, for example, in FIGS. 10 to 12, and/or a compound bottom electrode as shown, for example, in FIGS. 13 to 17.

In summary, a capacitor has been provided which incorporates a high dielectric constant material which minimizes or avoids contact between silicon and the high dielectric constant material, especially during high dielectric constant material deposition. In addition, patterning steps for the electrodes are minimized, and a good connection between the capacitor and the semiconductor circuit elements in the substrate (in the form of the conductive plug plus optional diffusion barrier). The capacitor described is thus suitable for large scale production.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A capacitor structure, comprising:
   a substrate having at least one layer of dielectric material thereon;
   a first conductor on top of the substrate;
   a first non-conductor on top of and in register with the first conductor, the first conductor and first non-conductor having a first opening formed therein;
   a second conductor, in electrical contact with the first conductor, formed on the sidewalls of the first opening;
   a non-conductive sidewall spacer formed in the first opening and contacting the second conductor, the non-conductive sidewall spacer having a second opening formed therein; and
   a third conductor formed in the second opening, wherein the third conductor does not fill the second opening so that a third opening is formed therein.

2. The capacitor structure of claim 1 wherein the second conductor forms approximately a 90 degree angle with the first conductor.

3. The capacitor structure of claim 1 wherein the first and second conductors form a compound plate electrode.

4. The capacitor structure of claim 1 wherein the non-conductive sidewall spacer is made of a high dielectric constant material.

5. The capacitor structure of claim 4 wherein the high dielectric constant material has a dielectric constant greater than approximately 20.

6. The capacitor structure of claim 4 wherein the high dielectric constant material is a material selected from the group consisting of ferroelectrics, paraelectrics, perovskites, pyrochlores, relaxors and layered perovskites.

7. The capacitor structure of claim 4 wherein the high dielectric constant material is $(Ba,Sr)TiO_3$.

8. The capacitor structure of claim 1 wherein the first non-conductor is a low dielectric constant material.

9. The capacitor structure of claim 8 wherein the low dielectric constant material is a material selected from the group consisting of $SiO_2$, $SiN_x$, $Al_2O_3$, $TiO_2$ and $HfO_2$.

10. The capacitor structure of claim 1 wherein the first conductor is made of a material selected from the group consisting of noble metals, alloys of noble metals with noble or non-noble metals, metals whose oxides are conducting, electrically conducting oxides and electrically conducting and oxidation-resistant nitrides and silicides.

11. The capacitor structure of claim 1 wherein the first conductor is made of a material selected from the group consisting of Au, Pt, Pd, Ir, Rh, Ru, Mo, $RuO_2$, $IrO_2$, $Re_2O_3$, TiN, TaN, TaSiN and WN.

12. The capacitor structure of claim 1 wherein the second conductor is made of a material selected from the group consisting of noble metals, alloys of noble metals with noble or non-noble metals, metals whose oxides are conducting, electrically conducting oxides and electrically conducting and oxidation-resistant nitrides and silicides.

13. The capacitor structure of claim 1 wherein the second conductor is made of a material selected from the group consisting of Au, Pt, Pd, Ir, Rh, Ru, Mo, $RuO_2$, $IrO_2$, and $Re_2O_3$.

14. The capacitor structure of claim 1 wherein the third conductor is made of a material selected from the group consisting of Rh, Pt, Pd, Ru, Ir, Au, TiN, WN, $RuO_2$, $Re_2O_3$ and $IrO_2$.

15. The capacitor structure of claim 1 wherein the third conductor has a top portion extending out over the first non-conductor.

16. The capacitor structure of claim 1 wherein the third opening is filled with a fill material.

17. The capacitor structure of claim 16 wherein the third conductor lines the sides and bottom of the second opening.

18. The capacitor structure of claim 17 wherein the fill material is a material selected from the group consisting of TiN, TaSiN, $SiO_2$, $Al_2O_3$, and $SiN_x$.

19. The capacitor structure of claim 16 wherein the fill material is a material selected from the group consisting of noble metals, alloys of noble metals with noble or non-electrically conducting oxides and electrically conducting and oxidation-resistant nitrides and silicides.

20. The capacitor structure of claim 1 wherein the first conductor is in direct contact with the substrate dielectric layer.

21. The capacitor structure of claim 1 wherein the high dielectric constant material is a material selected from the group consisting of ferroelectrics, paraelectrics, perovskites, pyrochlores, relaxors and layered perovskites.

22. The capacitor structure of claim 1 wherein the first conductor is in direct contact with the substrate dielectric layer.

23. A capacitor structure, comprising:
a substrate having at least one layer of dielectric material thereon;
a first conductor on top of the substrate;
a first non-conductor on top of and in register with the first conductor, the first conductor and first non-conductor having a first opening formed therein;
a second conductor, in electrical contact with the first conductor, formed on the sidewalls of the first opening;
a non-conductive sidewall spacer formed in the first opening and contacting the second conductor, the non-conductive sidewall spacer having a second opening formed therein;
a third conductor formed in the second opening; and
a second non-conductor disposed between the first conductor and the substrate dielectric layer.

24. The capacitor structure of claim 23 wherein the second conductor is in direct contact with the substrate dielectric layer.

25. The capacitor structure of claim 23 wherein the second non-conductor is in register with the first conductor.

26. The capacitor structure of claim 23 further comprising a third non-conductor below the second non-conductor.

27. The capacitor structure of claim 26 wherein the third non-conductor extends underneath the second conductor to contact the non-conductive sidewall spacer.

28. The capacitor structure of claim 26 wherein the third non-conductor is in direct contact with the substrate dielectric layer.

29. The capacitor structure of claim 26 wherein the third non-conductor extends underneath the non-conductive sidewall spacer to contact the third conductor.

30. The capacitor structure of claim 23 wherein the substrate dielectric layer has a third opening in register with the second opening, the second and third openings being contiguously filled with the third conductor.

31. A capacitor structure, comprising:
a substrate having at least one layer of dielectric material thereon;
a first conductor on top of the substrate;
a first non-conductor on top of and in register with the first conductor, the first conductor and first non-conductor having a first opening formed therein;
a second non-conductor on top of and in register with the first non-conductor
a second conductor, in electrical contact with the first conductor, formed on the sidewalls of the first opening;
a non-conductive sidewall spacer formed in the first opening and contacting the second conductor, the non-conductive sidewall spacer having a second opening formed therein; and
a third conductor formed in the second opening.

32. A capacitor structure, comprising:
a substrate having at least one layer of dielectric material thereon;
a first conductor on top of the substrate;
a first non-conductor on top of and in register with the first conductor, the first conductor and first non-conductor having a first opening formed therein;
a second conductor, in electrical contact with the first conductor, formed on the sidewalls of the first opening;
a non-conductive sidewall spacer formed in the first opening and contacting the second conductor, the non-conductive sidewall spacer having a second opening formed therein;
a third conductor formed in the second opening; and
a conductive plug formed in the substrate dielectric layer, the conductive plug providing electrical contact between the third conductor and circuit elements in the substrate.

33. The capacitor structure of claim 32 further comprising a diffusion barrier layer between the conductive plug and the third conductor, the diffusion barrier in register with the conductive plug.

34. The capacitor structure of claim 32 wherein the second conductor forms approximately a 90 degree angle with the first conductor.

35. The capacitor structure of claim 32 wherein the non-conductive sidewall spacer is made of a high dielectric constant material having a dielectric constant greater than approximately 20.

36. The capacitor structure of claim 32 wherein the high dielectric constant material is $(Ba,Sr)TiO_3$.

37. The capacitor structure of claim 32 wherein the first non-conductor is a low dielectric constant material.

38. The capacitor structure of claim 37 wherein the low dielectric constant material is a material selected from the group consisting of $SiO_2$, $SiN_x$, $Al_2O_3$, $TiO_2$ and $HfO_2$.

39. The capacitor structure of claim 32 wherein the first conductor is made of a material selected from the group consisting of noble metals, alloys of noble metals with noble or non-noble metals, metals whose oxides are conducting, electrically conducting oxides and electrically conducting and oxidation-resistant nitrides and silicides.

40. The capacitor structure of claim 32 wherein the first conductor is made of a material selected from the group consisting of Au, Pt, Pd, Ir, Rh, Ru, Mo, $RuO_2$, $IrO_2$, $Re_2O_3$, TiN, TaN, TaSiN and WN.

41. The capacitor structure of claim 32 wherein the second conductor is made of a material selected from the group consisting of noble metals, alloys of noble metals with noble or non-noble metals, metals whose oxides are conducting, electrically conducting oxides and electrically conducting and oxidation-resistant nitrides and silicides.

42. The capacitor structure of claim 32 wherein the second conductor is made of a material selected from the group consisting of Au, Pt, Pd, Ir, Rh, Ru, Mo, $RuO_2$, $IrO_2$, and $Re_2O_3$.

43. The capacitor structure of claim 32 wherein the third conductor is made of a material selected from the group consisting of Rh, Pt, Pd, Ru, Ir, Au, TiN, WN, $RuO_2$, $Re_2O_3$ and $IrO_2$.

44. The capacitor structure of claim 32 wherein the third conductor has a top portion extending out over the first non-conductor.

45. The capacitor structure of claim 32 further comprising a conductive sidewall spacer in between the non-conductive sidewall spacer and the third conductor.

46. The capacitor structure of claim 45 wherein the substrate dielectric layer has a third opening in register with the second opening, the second and third openings being contiguously filled with the third conductor.

47. A capacitor structure, comprising:

a substrate having at least one layer of dielectric material thereon;

a first conductor on top of the substrate;

a first non-conductor on top of and in register with the first conductor, the first conductor and first non-conductor having a first opening formed therein;

a second conductor, in electrical contact with the first conductor, formed on the sidewalls of the first opening;

a non-conductive sidewall spacer formed in the first opening and contacting the second conductor, the non-conductive sidewall spacer having a second opening formed therein;

a third conductor formed in the second opening; and a conductive sidewall spacer in between the non-conductive sidewall spacer and the third conductor.

48. The capacitor structure of claim 47 wherein the substrate dielectric layer has a third opening in register with the second opening, the second and third openings being contiguously filled with the third conductor.

49. A capacitor structure, comprising:

a substrate having at least one layer of dielectric material thereon;

a first conductor on top of the substrate;

a first non-conductor on top of and in register with the first conductor, the first conductor and first non-conductor having a first opening formed therein;

a second conductor, in electrical contact with the first conductor, formed on the sidewalls of the first opening;

a non-conductive sidewall spacer formed in the first opening and contacting the second conductor, the non-conductive sidewall spacer having a second opening formed therein; and a third conductor formed in the second opening;

wherein the substrate dielectric layer has a third opening in register with the second opening, the second and third openings being contiguously filled with the third conductor.

* * * * *